US012253639B2

(12) United States Patent
Ina et al.

(10) Patent No.: US 12,253,639 B2
(45) Date of Patent: Mar. 18, 2025

(54) SENSOR BOARD, RADIATION IMAGING APPARATUS, RADIATION IMAGING SYSTEM, AND METHOD OF MANUFACTURING SENSOR BOARD

(71) Applicant: CANON KABUSHIKI KAISHA, Tokyo (JP)

(72) Inventors: Masao Ina, Kanagawa (JP); Takamasa Ishii, Saitama (JP); Masato Ofuji, Gunma (JP); Katsuro Takenaka, Saitama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 246 days.

(21) Appl. No.: 18/163,432

(22) Filed: Feb. 2, 2023

(65) Prior Publication Data

US 2023/0258834 A1    Aug. 17, 2023

(30) Foreign Application Priority Data

Feb. 14, 2022   (JP) ................... 2022-020793

(51) Int. Cl.
*G01T 3/06*      (2006.01)
(52) U.S. Cl.
CPC ..................... *G01T 3/06* (2013.01)
(58) Field of Classification Search
CPC ... G01T 3/06; G01T 1/20183; G01T 1/20184; H01L 27/14663; H01L 27/14605; H01L 27/14625; H01L 27/14685; H04N 25/30; H04N 25/633; A61B 6/4208
See application file for complete search history.

(56) References Cited

U.S. PATENT DOCUMENTS

| 7,205,547 | B2 | 4/2007 | Ishii |
| 7,342,221 | B2 | 3/2008 | Takenaka |
| 7,343,000 | B2 | 3/2008 | Kameshima |
| 7,381,963 | B2 | 6/2008 | Endo |
| 7,381,965 | B2 | 6/2008 | Ishii |
| 7,386,089 | B2 | 6/2008 | Endo |
| 7,403,594 | B2 | 7/2008 | Endo |
| 7,408,167 | B1 | 8/2008 | Kameshima |

(Continued)

FOREIGN PATENT DOCUMENTS

JP         6-302798 A       10/1994
WO    WO 2019167424 A1 *   9/2019   ............... A61B 6/00

*Primary Examiner* — Edwin C Gunberg
*Assistant Examiner* — Richard O Toohey
(74) *Attorney, Agent, or Firm* — VENABLE LLP

(57) ABSTRACT

A sensor board comprising a substrate comprising a pixel region where pixels are arranged on a first surface of two surfaces, a scintillator arranged on one of the first surface and a second surface of the two surfaces and a light shielding member arranged on the surface on which the scintillator is arranged, is provided. The pixel region comprises a first region where a signal for radiation image is generated and a second region where a signal for correcting a signal output from the first region is generated. The scintillator is arranged to overlap the first region but not to overlap the second region. The light shielding member is arranged to cover the scintillator and overlap the second region. A portion of the light shielding member overlapping the second region is bonded to the surface on which the scintillator is arranged.

19 Claims, 9 Drawing Sheets

(56) References Cited

U.S. PATENT DOCUMENTS

| | | |
|---|---|---|
| 7,421,063 B2 | 9/2008 | Takenaka |
| 7,435,968 B2 | 10/2008 | Watanabe |
| 7,442,939 B2 | 10/2008 | Yagi |
| 7,465,933 B2 | 12/2008 | Ishii |
| 7,466,345 B2 | 12/2008 | Kameshima |
| 7,470,908 B2 | 12/2008 | Ishii |
| 7,476,027 B2 | 1/2009 | Takenaka |
| 7,488,948 B2 | 2/2009 | Ishii |
| 7,491,960 B2 | 2/2009 | Takenaka |
| 7,514,663 B2 | 4/2009 | Yagi |
| 7,514,690 B2 | 4/2009 | Endo |
| 7,532,706 B2 | 5/2009 | Kameshima |
| 7,535,506 B2 | 5/2009 | Nomura |
| 7,541,591 B2 | 6/2009 | Endo |
| 7,541,617 B2 | 6/2009 | Mochizuki |
| 7,550,733 B2 | 6/2009 | Endo |
| 7,557,355 B2 | 7/2009 | Mochizuki |
| 7,573,038 B2 | 8/2009 | Yokoyama |
| 7,573,041 B2 | 8/2009 | Kameshima |
| 7,613,277 B2 | 11/2009 | Takenaka |
| 7,629,564 B2 | 12/2009 | Mochizuki |
| 7,629,587 B2 | 12/2009 | Yagi |
| 7,642,517 B2 | 1/2010 | Ishii |
| 7,645,976 B2 | 1/2010 | Watanabe |
| 7,645,995 B2 | 1/2010 | Yagi |
| 7,683,337 B2 | 3/2010 | Takenaka |
| 7,696,484 B2 | 4/2010 | Yokoyama |
| 7,718,973 B2 | 5/2010 | Endo |
| 7,724,874 B2 | 5/2010 | Kameshima |
| 7,732,776 B2 | 6/2010 | Takenaka |
| 7,732,778 B2 | 6/2010 | Yokoyama |
| 7,750,309 B2 | 7/2010 | Endo |
| 7,750,422 B2 | 7/2010 | Watanabe |
| 7,791,034 B2 | 9/2010 | Kameshima |
| 7,791,035 B2 | 9/2010 | Yokoyama |
| 7,812,317 B2 | 10/2010 | Watanabe |
| 7,847,263 B2 | 12/2010 | Yagi |
| 7,850,367 B2 | 12/2010 | Takenaka |
| 7,858,947 B2 | 12/2010 | Mochizuki |
| 7,869,568 B2 | 1/2011 | Yokoyama |
| 7,880,145 B2 | 2/2011 | Yagi |
| 7,897,930 B2 | 3/2011 | Mochizuki |
| 7,923,695 B2 | 4/2011 | Ishii |
| 7,932,946 B2 | 4/2011 | Ishii |
| 7,989,772 B2 | 8/2011 | Yagi |
| 8,107,588 B2 | 1/2012 | Kameshima |
| 8,154,641 B2 | 4/2012 | Nomura |
| 8,167,486 B2 | 5/2012 | Takenaka |
| 8,222,611 B2 | 7/2012 | Yagi |
| 8,247,779 B2 | 8/2012 | Kameshima |
| 8,368,027 B2 | 2/2013 | Ishii |
| 8,440,975 B2 | 5/2013 | Inoue |
| 8,519,344 B2 | 8/2013 | Ishii |
| 8,576,294 B2 | 11/2013 | Kameshima |
| 8,680,472 B2 | 3/2014 | Mochizuki |
| 8,723,996 B2 | 5/2014 | Yokoyama |
| 8,792,024 B2 | 7/2014 | Takenaka |
| 8,809,795 B2 | 8/2014 | Takenaka |
| 8,829,438 B2 | 9/2014 | Sato |
| 8,878,972 B2 | 11/2014 | Wayama |
| 8,957,383 B2 | 2/2015 | Sasaki |
| 9,048,154 B2 | 6/2015 | Takenaka |
| 9,081,104 B2 | 7/2015 | Sawada |
| 9,128,196 B2 | 9/2015 | Sato |
| 9,134,432 B2 | 9/2015 | Iwashita |
| 9,234,966 B2 | 1/2016 | Sugawara |
| 9,270,903 B2 | 2/2016 | Wayama |
| 9,277,896 B2 | 3/2016 | Ofuji |
| 9,354,333 B2 | 5/2016 | Inoue |
| 9,366,767 B2 | 6/2016 | Inoue |
| 9,423,512 B2 | 8/2016 | Sato |
| 9,423,513 B2 | 8/2016 | Watanabe |
| 9,445,030 B2 | 9/2016 | Yagi |
| 9,462,989 B2 | 10/2016 | Takenaka |
| 9,468,414 B2 | 10/2016 | Ryu |
| 9,470,800 B2 | 10/2016 | Iwashita |
| 9,470,802 B2 | 10/2016 | Okada |
| 9,521,347 B2 | 12/2016 | Kawanabe |
| 9,529,094 B2 | 12/2016 | Ishii |
| 9,541,653 B2 | 1/2017 | Iwashita |
| 9,625,585 B1 | 4/2017 | Yokoyama |
| 9,655,586 B2 | 5/2017 | Yagi |
| 9,661,240 B2 | 5/2017 | Fujiyoshi |
| 9,675,307 B2 | 6/2017 | Ofuji |
| 9,726,767 B2 | 8/2017 | Kawanabe |
| 9,737,271 B2 | 8/2017 | Iwashita |
| 9,812,474 B2 | 11/2017 | Yagi |
| 9,835,732 B2 | 12/2017 | Fujiyoshi |
| 9,838,638 B2 | 12/2017 | Furumoto |
| 9,948,871 B2 | 4/2018 | Wayama |
| 9,971,046 B2 | 5/2018 | Ryu |
| 9,977,135 B2 | 5/2018 | Yokoyama |
| 9,980,685 B2 | 5/2018 | Iwashita |
| 9,989,656 B2 | 6/2018 | Sato |
| 10,009,990 B2 | 6/2018 | Takenaka |
| 10,068,943 B2 | 9/2018 | Fujiyoshi |
| 10,197,684 B2 | 2/2019 | Terui |
| 10,345,455 B2 | 7/2019 | Ishii |
| 10,349,914 B2 | 7/2019 | Takenaka |
| 10,416,323 B2 | 9/2019 | Ryu |
| 10,441,238 B2 | 10/2019 | Terui |
| 10,448,908 B2 | 10/2019 | Sasaki |
| 10,537,295 B2 | 1/2020 | Watanabe |
| 10,634,800 B2 | 4/2020 | Yokoyama |
| 10,716,522 B2 | 7/2020 | Sato |
| 10,914,849 B2 | 2/2021 | Ofuji |
| 11,047,808 B2 | 6/2021 | Iwashita |
| 11,086,030 B2 | 8/2021 | Nishibe |
| 11,187,816 B2 | 11/2021 | Takenaka |
| 11,280,919 B2 | 3/2022 | Takenaka |
| 2005/0184244 A1* | 8/2005 | Yoshimuta ............ G01T 1/244 250/370.01 |
| 2010/0193692 A1* | 8/2010 | Mori ................... H04N 25/671 250/366 |
| 2010/0294942 A1* | 11/2010 | Mochizuki ............ H04N 25/60 250/366 |
| 2012/0138807 A1* | 6/2012 | Kondou ................ H04N 25/30 250/370.08 |
| 2013/0146777 A1* | 6/2013 | Lim .................... G01T 1/20184 250/370.09 |
| 2021/0285896 A1 | 9/2021 | Iwashita |
| 2023/0080926 A1* | 3/2023 | Nakano ............ H01L 27/14663 250/370.11 |

* cited by examiner

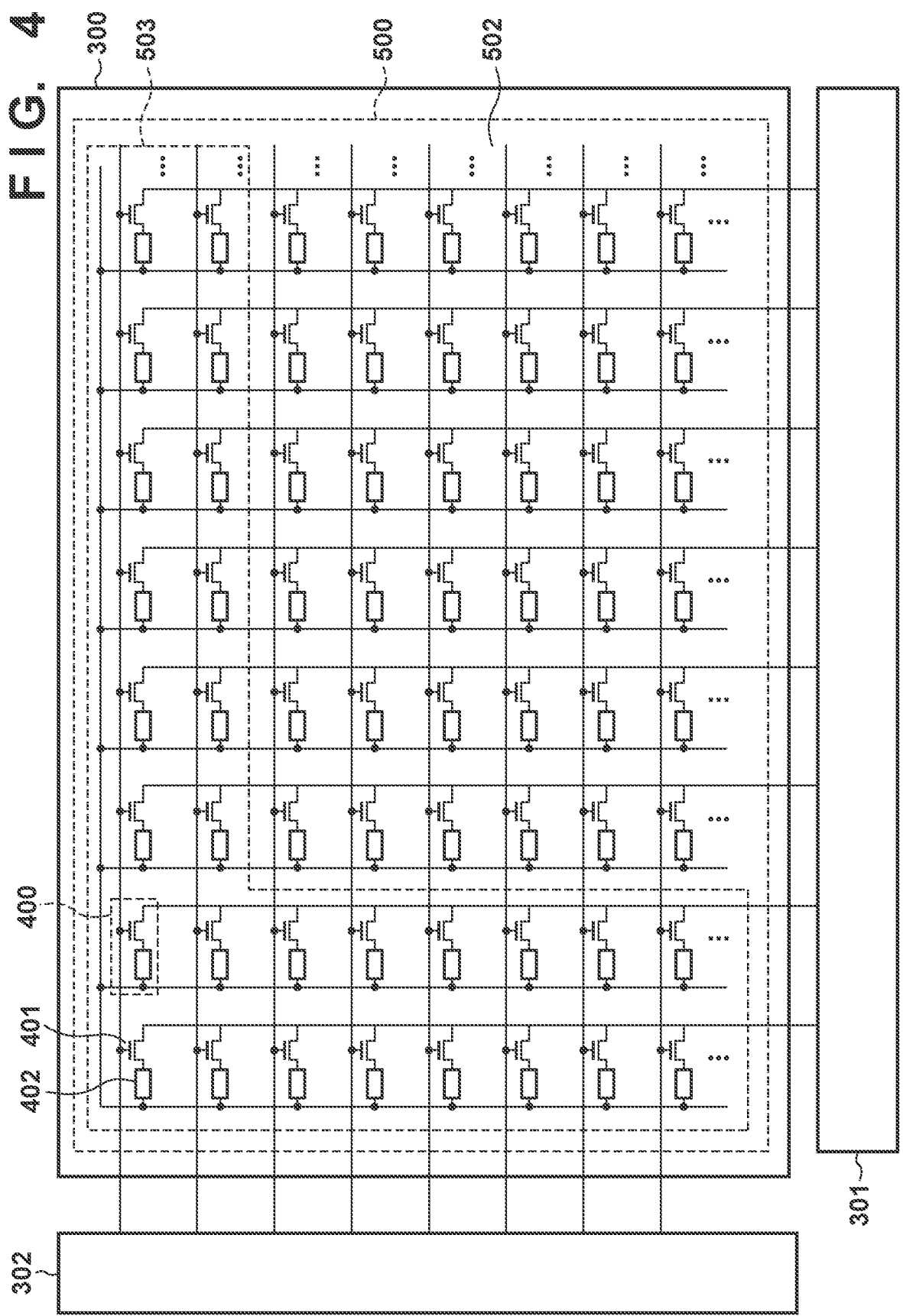

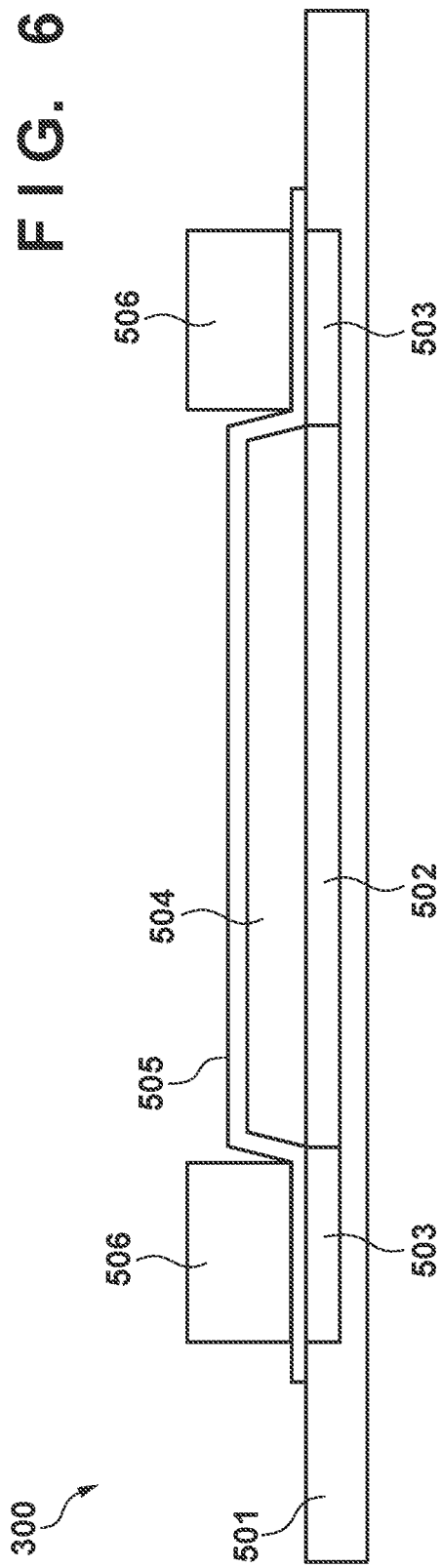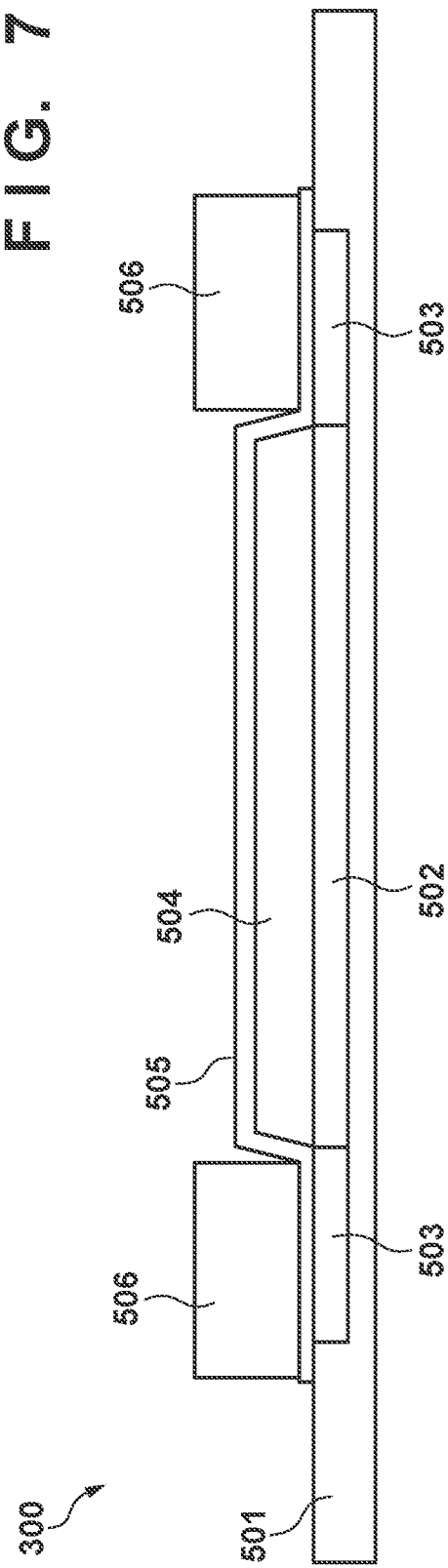

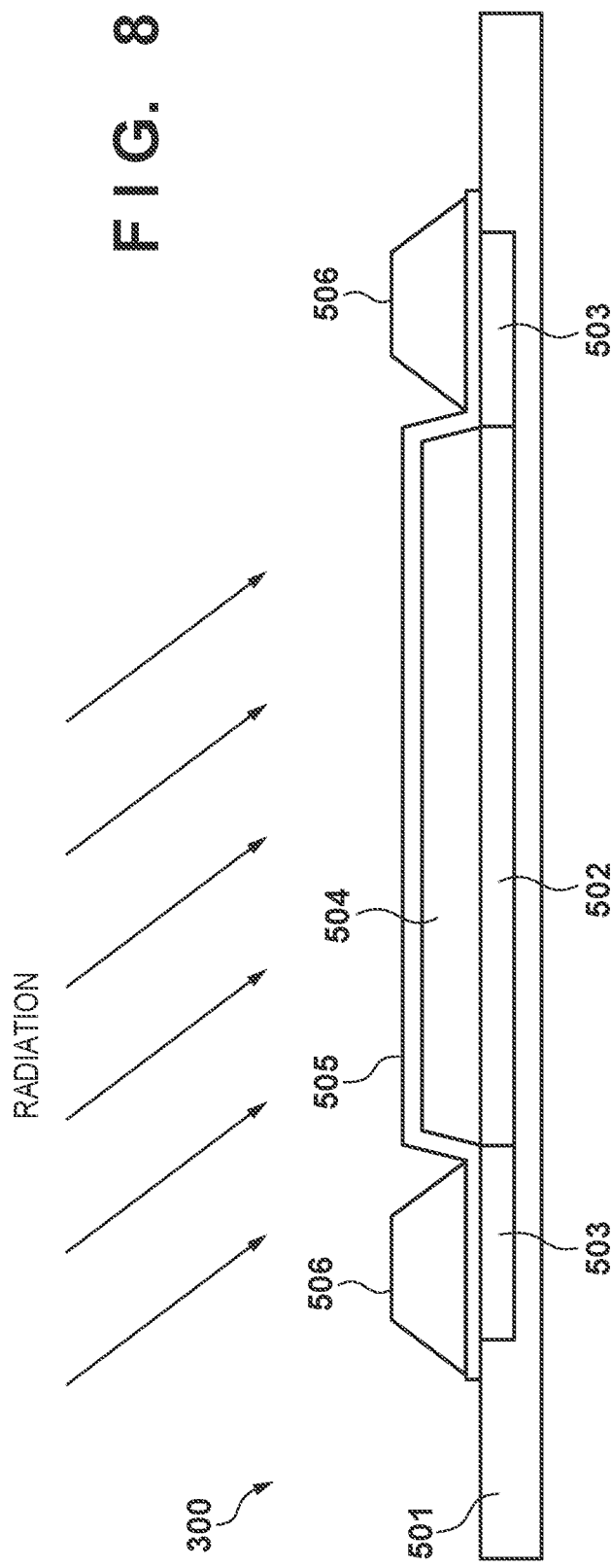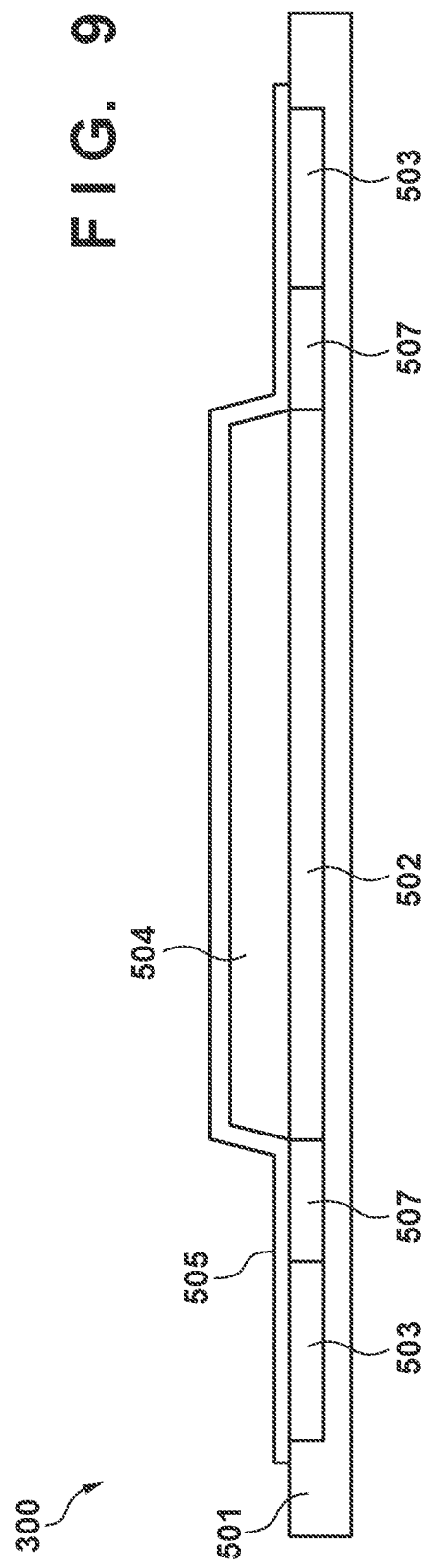

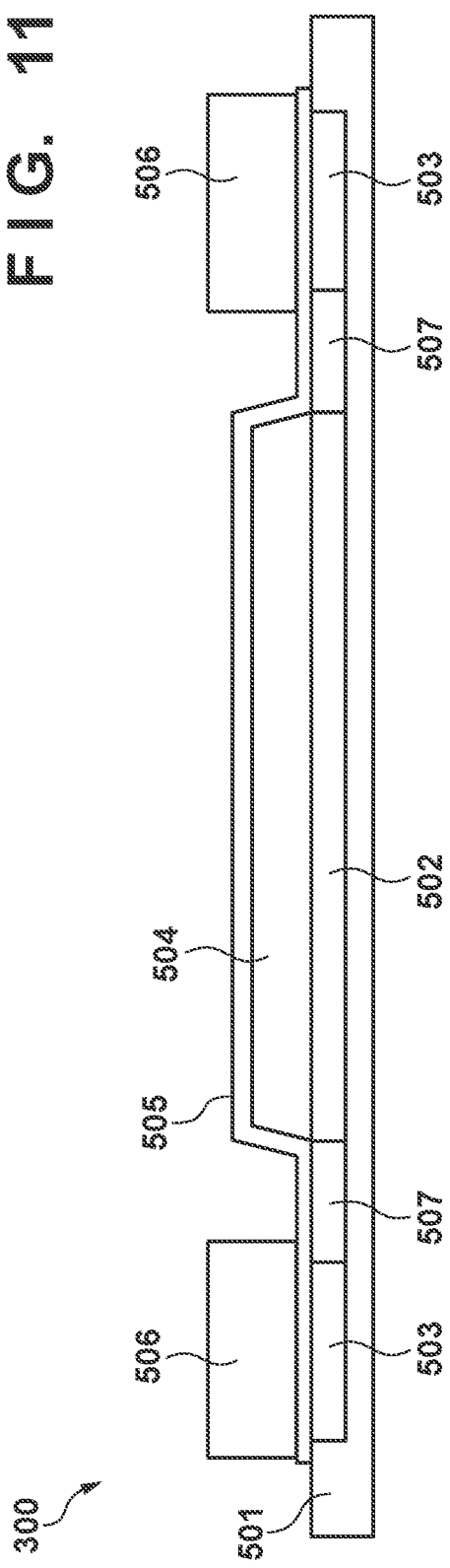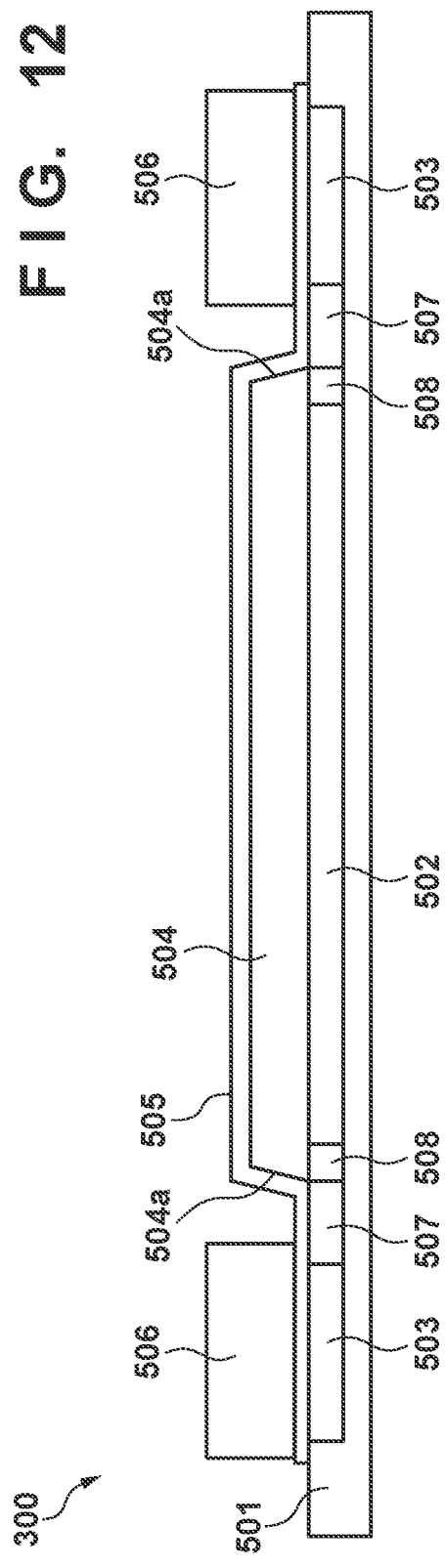

SENSOR BOARD, RADIATION IMAGING APPARATUS, RADIATION IMAGING SYSTEM, AND METHOD OF MANUFACTURING SENSOR BOARD

BACKGROUND

Field

The present disclosure relates to a sensor board, a radiation imaging apparatus, a radiation imaging system, and a method of manufacturing the sensor board.

Description of the Related Art

For medical image diagnosis and nondestructive inspection, a radiation imaging apparatus in which a plurality of pixels for detecting radiation are arranged has been put into practice. In a sensor board used in the radiation imaging apparatus, offset may occur in output of each pixel due to a difference in environment such as temperature corresponding to the position at which the pixel is arranged. Japanese Patent Laid-Open No. 6-302798 describes that offset correction is performed on a signal output from a light receiving portion using a signal output from an Optical Black (OB) pixel portion covered with a metal light shielding layer.

SUMMARY

Japanese Patent Laid-Open No. 6-302798 discloses a solid imaging apparatus, but does not disclose a sensor board using a scintillator for acquiring a radiation image.

Some embodiments of the present disclosure provide a technique advantageous in implementing a light receiving region and a light shielding region in a pixel region with a simpler structure on a sensor board.

According to some embodiments, a sensor board comprising: a substrate comprising a pixel region where a plurality of pixels are arranged on a first principal surface of two principal surfaces; a scintillator arranged on one of the first principal surface and a second principal surface of the two principal surfaces; and a light shielding member arranged on the principal surface of the two principal surfaces on which the scintillator is arranged, wherein the pixel region comprises a first region where pixels among the plurality of pixels, each of which generates a signal corresponding to each pixel of a radiation image, are arranged, and a second region where pixels among the plurality of pixels, each of which generates a signal for correcting a signal output from the first region, are arranged, the scintillator is arranged so as to overlap the first region but not to overlap the second region in an orthogonal projection with respect to the first principal surface, the light shielding member is arranged so as to cover the scintillator and overlap the second region in the orthogonal projection with respect to the first principal surface, and a portion of the light shielding member overlapping the second region is bonded to the principal surface of the two principal surfaces on which the scintillator is arranged, is provided.

According to some other embodiments, a method of manufacturing a sensor board comprising a substrate comprising a pixel region where a plurality of pixels are arranged on a first principal surface of two principal surfaces, a scintillator arranged on one of the first principal surface and a second principal surface of the two principal surfaces, and a light shielding member arranged on the principal surface of the two principal surfaces on which the scintillator is arranged, wherein the pixel region comprises a first region where pixels among the plurality of pixels, each of which generates a signal corresponding to each pixel of a radiation image, are arranged, and a second region where pixels among the plurality of pixels, each of which generates a signal for correcting a signal output from the first region, are arranged, and the method comprises: forming the scintillator so as to overlap the first region but not to overlap the second region in an orthogonal projection with respect to the first principal surface; and arranging the light shielding member so as to cover the scintillator and overlap the second region in the orthogonal projection with respect to the first principal surface, and bonding a portion of the light shielding member overlapping the second region to the principal surface of the two principal surfaces on which the scintillator is arranged, is provided.

Further features of the present disclosure will become apparent from the following description of exemplary embodiments (with reference to the attached drawings).

BRIEF DESCRIPTION OF THE DRAWINGS

FIG. 4 is a view showing an example of a circuit arrangement of the sensor board shown in FIG. 3;

FIG. 6 is a view showing another arrangement example of the sensor board shown in FIG. 3;

FIG. 7 is a view showing still another arrangement example of the sensor board shown in FIG. 3;

FIG. 8 is a view showing still another arrangement example of the sensor board shown in FIG. 3;

FIG. 9 is a view showing still another arrangement example of the sensor board shown in FIG. 3;

FIG. 11 is a view showing still another arrangement example of the sensor board shown in FIG. 3;

FIG. 12 is a view showing still another arrangement example of the sensor board shown in FIG. 3.

DESCRIPTION OF THE EMBODIMENTS

Figure 1:
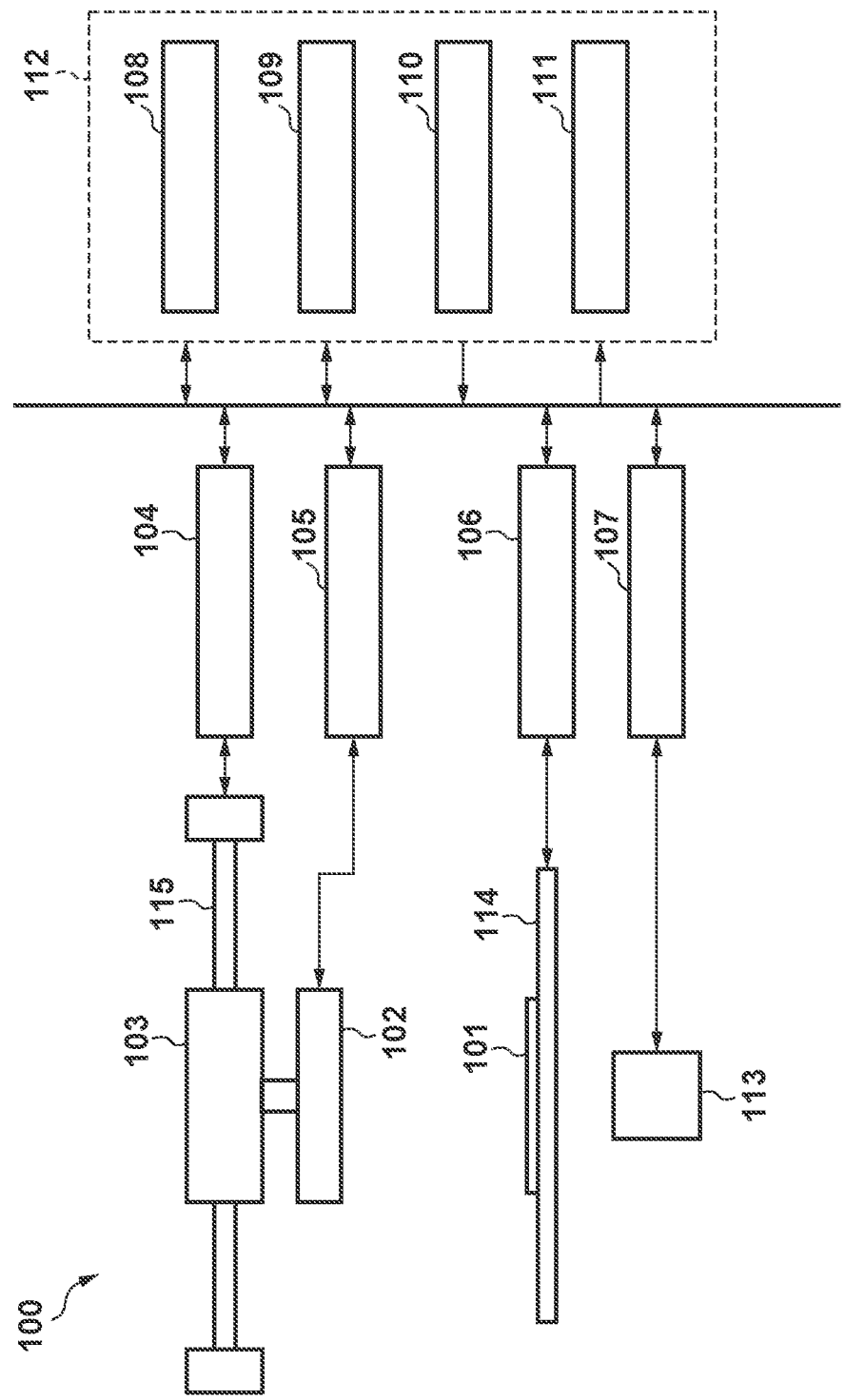
FIG. 1 is a block diagram showing a configuration example of a radiation imaging system using a radiation imaging apparatus including a sensor board according to an embodiment.

Hereinafter, embodiments will be described in detail with reference to the accompanying drawings. It should be noted that the following embodiments are not intended to limit the scope of the appended claims. A plurality of features are described in the embodiments. However, not all the plurality of features are necessarily essential to the present disclosure, and the plurality of features may arbitrarily be combined. In addition, the same reference numerals denote the same or similar parts in the accompanying drawings, and a repetitive description will be omitted.

Radiation in the present disclosure can include α-rays, β-rays, γ-rays, and the like which are beams generated by particles (including photons) emitted by radiation decay, as well as beams having the similar or higher energy, for example, X-rays, particle beams, cosmic rays, and the like.

With reference to FIGS. 1 to 13, a sensor board according to an embodiment of the present disclosure, a radiation imaging apparatus including the sensor board, and a radiation imaging system using the radiation imaging apparatus will be described. FIG. 1 is a block diagram showing a configuration example of a radiation imaging system 100 using a radiation imaging apparatus 102 including a sensor board 300 according to the embodiment. The sensor board 300 will be described in detail with reference to FIGS. 3 to 13.

The radiation imaging system 100 according to this embodiment can include a system control apparatus 112, the radiation imaging apparatus 102, a radiation source 113, a stage 114, a supporting apparatus 103, a 2-axis orthogonal type robot arm 115, an arm control apparatus 104, an image acquisition apparatus 105, a stage control apparatus 106, and a radiation source control apparatus 107. The system control apparatus 112 controls the entire radiation imaging system 100. The system control apparatus 112 can include an arithmetic unit 108, a storage unit 109, an input unit 110, and an output unit 111. The arithmetic unit 108 may be formed by including, for example, a processor such as a CPU. When the processor of the arithmetic unit 108 executes a program stored in the storage unit 109 such as a RAM or a ROM, an operation of the radiation imaging system 100 can be performed. The arithmetic unit 108 may be formed by a dedicated circuit such as an Application Specific Integrated Circuit (ASIC). The input unit 110 and the output unit 111 can be user interfaces. The input unit 110 can include a keyboard or a touch panel used by a user to input an imaging condition for capturing a radiation image. The output unit 111 can include a display or the like used to display a radiation image obtained by the radiation imaging apparatus 102. The display may also serve as the above-describe touch panel.

The radiation source 113 is arranged to emit radiation to the radiation imaging apparatus 102 (sensor board 300). The radiation source control apparatus 107 controls emission of radiation from the radiation source 113 in accordance with a signal transferred from the system control apparatus 112.

An object 101 is arranged on the stage 114. In this embodiment, the radiation imaging system 100 is configured to be capable of changing the relative positional relationship among the radiation source 113, the object 101, and the radiation imaging apparatus 102. The stage control apparatus 106 controls the position of the stage 114 in accordance with a signal transferred from the system control apparatus 112. Similarly, the arm control apparatus 104 controls the position of the radiation imaging apparatus 102 attached to the supporting apparatus 103 by controlling the robot arm 115 in accordance with a signal transferred from the system control apparatus 112.

The image acquisition apparatus 105 transfers data such as an imaging condition to the radiation imaging apparatus 102 in accordance with a signal transferred from the system control apparatus 112. Further, the image acquisition apparatus 105 acquires data of a captured radiation image from the radiation imaging apparatus 102, and transfers the data to the system control apparatus 112. The image acquisition apparatus 105 may perform image processing or the like on the data of the radiation image.

Figure 2:
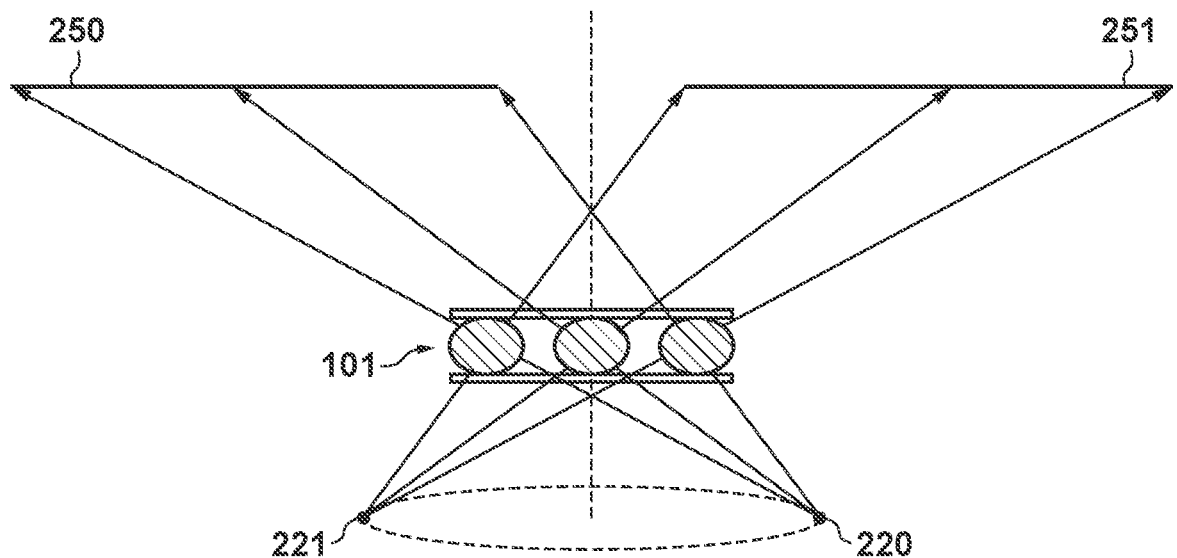
FIG. 2 is a view showing an example of an imaging method in the radiation imaging system shown in FIG. 1.

FIG. 2 is a view showing an example of capturing a radiation image while changing the relative positional relationship among the radiation source 113, the object 101, and the radiation imaging apparatus 102. In one aspect, the positional relationship among the radiation source 113, the object 101, and the radiation imaging apparatus 102 is defined as a radiation focal position 220 decided by the position at which the radiation source 113 is arranged, the object 101, and a position 250 at which the radiation imaging apparatus 102 is arranged. In this case, the radiation emitted from the radiation source 113 is output from the radiation focal position 220, transmitted through the object 101, and detected by the radiation imaging apparatus 102 located at the position 250. In another aspect, when the radiation source 113 is located at a position defined as a radiation focal position 221, the radiation emitted from the radiation source 113 is transmitted through the object 101, and detected by the radiation imaging apparatus 102 located at a position 251. In this manner, the radiation imaging system 100 can perform imaging while changing the positional relationship among the radiation source 113, the object 101, and the radiation imaging apparatus 102. With this configuration, the radiation imaging system 100 according to this embodiment can obtain a reconstructed image of a tomography image of the object 101. However, the present disclosure is not limited to this, and imaging may be performed without changing the relative positional relationship among the radiation source 113, the object 101, and the radiation imaging apparatus 102.

Figure 3:
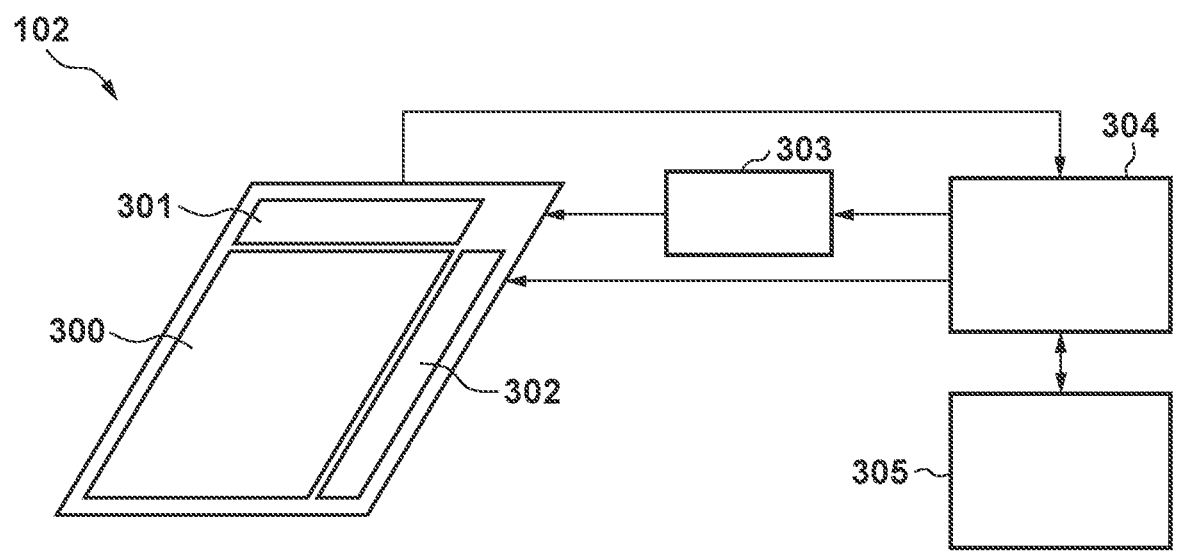
FIG. 3 is a view showing an arrangement example of the radiation imaging apparatus shown in FIG. 1.

FIG. 3 shows an arrangement example of the radiation imaging apparatus 102. The radiation imaging apparatus 102 includes the sensor board 300, a readout circuit 301, a driving circuit 302, a power supply unit 303, a control circuit 304, and a memory 305. The power supply unit 303 supplies power to respective components in the radiation imaging apparatus 102. The control circuit 304 controls respective components such as the readout circuit 301 and the driving circuit 302 arranged in the radiation imaging apparatus 102, thereby controlling an operation of the sensor board 300. The control circuit 304 may be formed by including, for example, a processor such as a CPU. For example, the radiation imaging apparatus 102 may be operated by the processor of the control circuit 304 executing a program stored in the memory 305, which is formed using a RAM, a ROM, or the like, in accordance with a signal transferred from the system control apparatus 112. The control circuit 304 may be formed by a dedicated circuit such as an ASIC.

The sensor board 300 is driven by the driving circuit 302 in accordance with a signal from the control circuit 304. Incident radiation is converted into an electric charge signal by the sensor board 300, and read out by the readout circuit 301 in accordance with a signal from the control circuit 304. The readout electric charge signal may undergo processing such as correction by the control circuit 304, and it may be temporarily stored in the memory 305 or transferred to the image acquisition apparatus 105.

FIG. 4 is a view showing an example of the circuit arrangement of the sensor board 300. The sensor board 300 may be created on an insulating substrate such as a glass substrate using a manufacturing process similar to the manufacturing process of a liquid crystal panel or the like. Alternatively, the sensor board 300 may be created on a semiconductor substrate such a silicon substrate using a manufacturing process similar to the manufacturing process of an image sensor. The sensor board 300 may be created on any substrate as long as a plurality of pixels 400 (image region 500) for detecting radiation to be described later can be arranged.

The sensor board 300 includes the pixel region 500 where the plurality of pixels 400 are arranged in a matrix. The pixel region 500 includes a region 502 where pixels among the plurality of pixels 400, each of which generates a signal corresponding to each pixel of a radiation image, are arranged, and a region 503 where pixels among the plurality of pixels 400, each of which generates a signal for correcting a signal output from the region 502, are arranged. The region 502 can also be referred to as an effective pixel region or the like. The region 503 can also be referred to as an Optical Black (OB) pixel region or the like. The pixel 400 includes a switch element 401 and a photoelectric conversion element 402. A Thin Film Transistor (TFT) or the like is used as the switch element 401. A photodiode or the like is used as the photoelectric conversion element 402. The structure of the pixel 400 arranged in the region 502 may be the same as the structure of the pixel 400 arranged in the region 503.

Figure 5A:
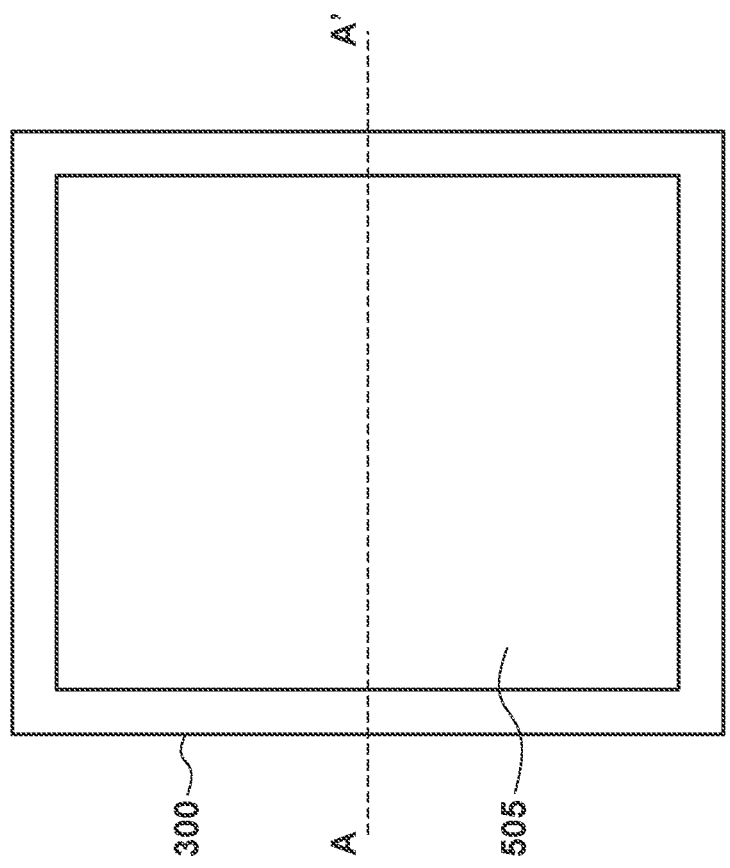
FIGS. 5A and 5B are views showing an arrangement example of the sensor board shown in FIG. 3.
Figure 5B:
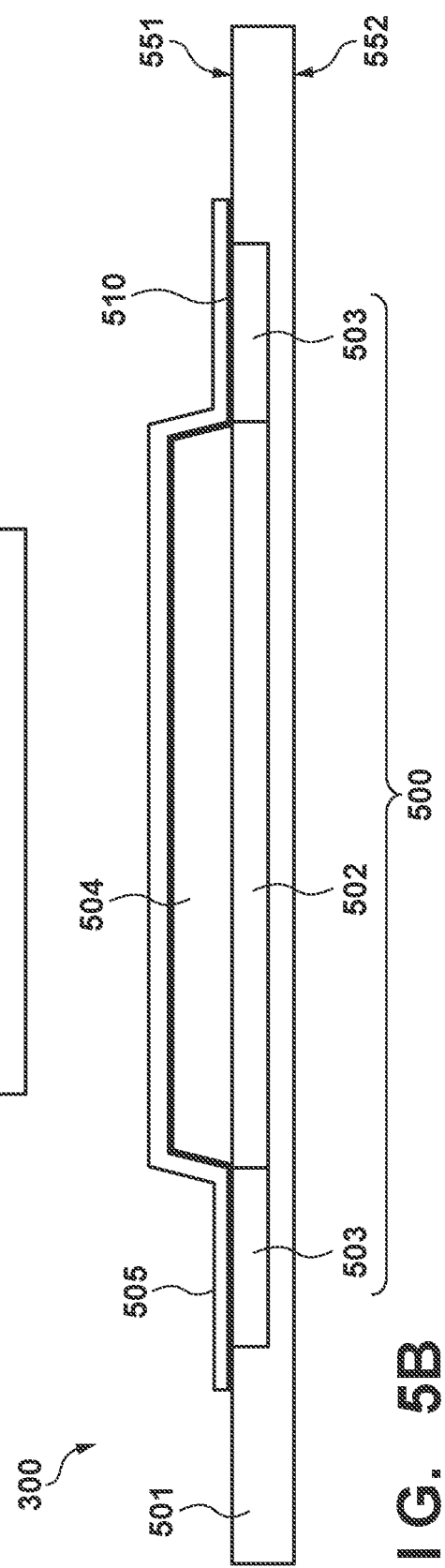

The sensor board 300 according to this embodiment will be further described with reference to FIGS. 5A and 5B. FIG. 5A is a top view of the sensor board 300, and FIG. 5B is a sectional view taken along a line A-A' in FIG. 5A. The sensor board 300 includes a substrate 501 including the pixel region 500 where the plurality of pixels 400 are arranged on one principal surface 551 of two principal surfaces, and a scintillator 504 arranged on the principal surface 551 or a principal surface 552 of the two principal surfaces. In this embodiment, the scintillator 504 is arranged on the principal surface 551 of the two principal surfaces. Further, the sensor board 300 includes a light shielding member 505 arranged on the principal surface (the principal surface 551 in this embodiment) of the two principal surfaces, on which the scintillator 504 is arranged.

In an orthogonal projection with respect to the principal surface 551, the scintillator 504 is arranged so as to overlap the region 502 where the pixels, each of which generates a signal corresponding to each pixel of a radiation image, are arranged, but so as not to overlap the region 503 where the pixels, each of which generates a signal for correcting a signal output from the region 502, are arranged. The light shielding member 505 is arranged so as to cover the scintillator 504 and overlap the region 503 in the orthogonal projection with respect to the principal surface 551. In this case, a portion of the light shielding member 505 overlapping the region 503 is bonded to the principal surface 551 on which the scintillator 504 is arranged.

In this embodiment, the scintillator 504 is arranged so as to cover the region 502 of the principal surface 551. Further, in this embodiment, the light shielding member 505 is formed using an aluminum sheet for protecting the scintillator 504 from moisture. That is, the region 503 is shielded from light by the aluminum sheet serving as the light shielding member 505, and the light shielding member 505 has both a role as a moisture-proof protective layer for the scintillator 504 and a role of shielding the region 503 from light. In this case, for example, as shown in FIG. 5B, the light shielding member 505 may be bonded to the principal surface 551 of the substrate 501 via a bonding member 510 such as a pressure sensitive adhesive provided on the aluminum sheet. The bonding member 510 is not limited to the pressure sensitive adhesive. For example, an adhesive or a double-sided adhesive tape may be used as the bonding member 510.

The scintillator 504 converts radiation into light (for example, visible light) that can be converted into an electric signal by the photoelectric conversion element 402 of the pixel 400. The pixel 400 arranged in the region 502 detects the light converted by the scintillator 504, and converts it into an electric signal. The scintillator 504 is arranged in the region 502 but not arranged in the region 503. That is, it can be said that the arrangement of the scintillator 504 decides the position of the region 502 in the pixel region 500. Further, the region 503 is a region of the pixel region 500 which is covered with the light shielding member 505 without intervening the scintillator 504. For example, the scintillator 504 is formed on the principal surface 551 of the substrate 501 using a hard mask or the like. Then, an aluminum sheet serving as the light shielding member 505 is bonded via the bonding member 510 so as to cover the entire pixel region 500. With these steps, the region 502 where light enters in the pixel region 500, and the region 503 shielded from light can be implemented with a simpler structure without using a photolithography step.

For example, consider a case in which, after the pixel region 500 is designed (created), it is necessary to change the positions of the region 502 and region 503. In this case, if the number of rows and number of columns of the pixels 400 included in the region 502 before changing the position are equal to the number of rows and number of columns of the pixels 400 included in the region 502 after changing the position, the positions of the region 502 and region 503 can be changed by changing the formation position of the scintillator 504 without changing the design of the pixel region 500. The position of the scintillator 504 can be relatively easily changed by adjusting the position of the hard mask upon forming the scintillator 504. Even if the size of the region 502 (the number of pixels 400 arranged therein) is changed, the hard mask can be easily created in terms of cost and time as compared to a photomask used in a photolithography step. Hence, even after completion of the design of the pixel region 500, the positions of the region 502 and region 503 can be freely decided in the pixel region 500. That is, as compared to a case in which a photolithography step is used to form the light shielding member 505 and a photomask is recreated upon changing the design, the degree of freedom of design of the pixel region 500 of the sensor board 300 is largely improved.

In this embodiment, a case has been described in which the aluminum sheet that also serves as the moisture-proof protective layer for the scintillator 504 is used as the light shielding member 505 covering the region 503. Therefore, in the orthogonal projection with respect to the principal surface 551, a portion of the light shielding member 505 overlapping the region 503 and a portion overlapping the scintillator 504 are connected to each other. However, the present disclosure is not limited to this. The light shielding member 505 may be provided for the region 503 separately from the moisture-proof protective layer for the scintillator 504. Also in this case, the light-shielded region 503 can be implemented by, for example, bonding an aluminum sheet or the like to the principal surface 551 of the substrate 501 using the bonding member 510 such as a pressure sensitive adhesive, an adhesive, or a double-sided adhesive tape such that the aluminum sheet overlaps the region 503. The light shielding member 505 is not limited to contain aluminum like the aluminum sheet. The light shielding member 505 may be formed by a metal sheet other than the aluminum sheet. Alternatively, for example, a black resin sheet or the like may be used as the light shielding member 505. The light shielding member 505 is not limited to be bonded to the principal surface 551 of the substrate 501 via the bonding member 510. For example, the light shielding member 505 using a black resin or metal paste may be bonded to the principal surface 551 of the substrate 501 by applying the black resin or metal paste so as to cover the region 503.

When the substrate 501 is a transparent substrate using a glass substrate, a plastic substrate, or the like, the scintillator 504 may be arranged not on the principal surface 551 but the principal surface 552 of the substrate 501. In this case, the light shielding member 505 can be arranged on the principal surface 552. For example, the light shielding member 505 may be arranged on each of the principal surface 551 and the principal surface 552. The scintillator 504 may be arranged on each of the principal surface 551 and the principal surface 552 so as to cover it. In this case, the light shielding member 505 may also be arranged on each of the principal surface 551 and the principal surface 552.

Next, a modification of the sensor board 300 shown in FIG. 5B will be described with reference to FIG. 6. The sensor board 300 shown in FIG. 6 includes a shielding member 506 for shielding radiation, which is arranged so as to at least partially overlap the region 503 in the orthogonal projection with respect to the principal surface 551 of the substrate 501. The shielding member 506 may be arranged on the principal surface 551 so as to cover the light shielding member 505 as shown in FIG. 6. In the radiation imaging system 100 shown in FIG. 1, the shielding member 506 is arranged between the radiation source 113 and the substrate 501. Accordingly, in accordance with the configuration of the radiation imaging system 100, the shielding member 506 may be arranged on the principal surface 552 of the substrate 501. Alternatively, for example, the shielding member 506 may be arranged on each of the principal surface 551 and the principal surface 552 of the substrate 501. The shielding member 506 can be formed using a material having a specific gravity higher than that of the light shielding member 505. As has been described above, the light shielding member 505 can contain aluminum or the like. On the other hand, the shielding member 506 can contain, for example, at least one of lead or tungsten. By arranging the shielding member 506, radiation entering the region 503 is suppressed. This can suppress a deterioration of the pixel 400 arranged in the region 503 caused by the incident radiation, and stabilize the output. Since the shielding member 506 has a function of suppressing incident radiation, in the orthogonal projection with respect to the principal surface 551 of the substrate 501, the shielding member 506 can be arranged so as not to overlap the region 502 where the pixels 400, each of which generates a signal corresponding to each pixel of a radiation image, are arranged.

In this embodiment, as shown in FIG. 6, a lead member is arranged as the shielding member 506 so as to overlap the region 503. The shielding member 506 using lead or the like is bonded to the light shielding member 505 using, for example, a bonding member such as a double-sided adhesive tape. As shown in FIG. 7, the shielding member 506 may be larger than the region 503. With this arrangement, radiation obliquely entering the region 503 of the sensor board 300 can be prevented. Further, as shown in FIG. 8, the shielding member 506 may be arranged so as not to overlap the region 502 when viewed from the incident direction of radiation. In other words, in the radiation imaging system 100, the shielding member 506 may be arranged so as not to overlap a virtual line connecting the radiation source 113 and the region 502. For example, as has been described, there is a case in which the radiation imaging system 100 is configured to be capable of changing the relative positional relationship among the radiation source 113, the object 101, and the radiation imaging apparatus 102. In this case, radiation may enter obliquely with respect to the principal surface 551 of the substrate 501. Therefore, for example, the side wall of the shielding member 506 on the region 502 side may be chamfered as shown in FIG. 8. With this, it is possible to suppress that components of radiation emitted from the radiation source 113 and entering the region 502 are shielded (shaded) by the shielding member 506.

Figure 10:
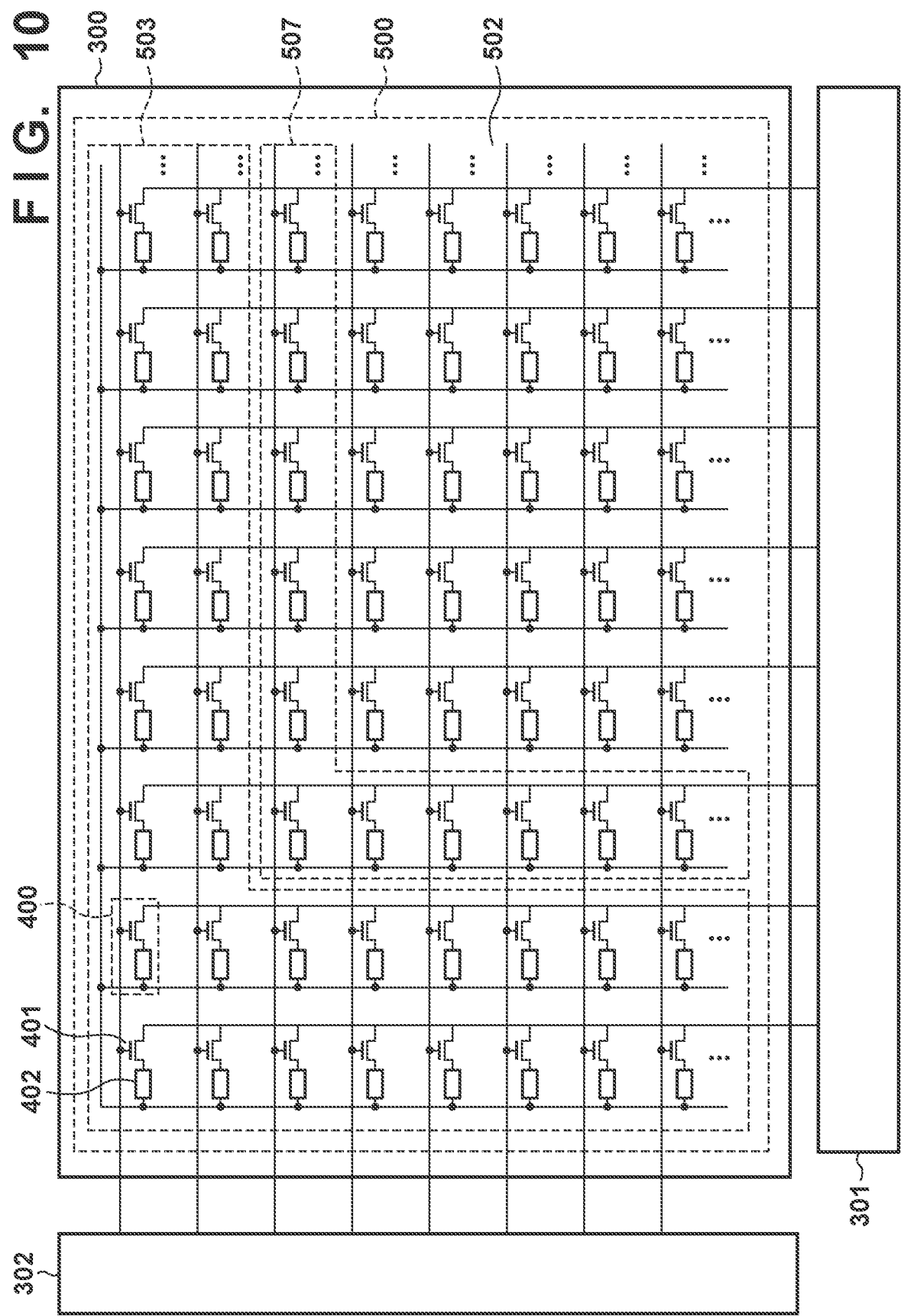
FIG. 10 is a view showing still another arrangement example of the sensor board shown in FIG. 3.

The pixels 400 arranged in the pixel region 500 are not limited pixels arranged in the region 502, each of which generates a signal corresponding to each pixel of a radiation image, and pixels arranged in the region 503, each of which generates a signal for correcting a signal output from the region 502. The plurality of pixels 400 may include a pixel not used for generation of a radiation image. For example, as shown in FIGS. 9 and 10, a region 507 where a pixel among the plurality of pixels 400, which is not used for generation of a radiation image, is arranged may be further arranged between the region 502 and the region 503 of the pixel region 500. The region 507 can also be referred to as a dummy pixel region, and the pixel 400 among the plurality of pixels 400, which is arranged in the region 507, can also be referred to as a dummy pixel.

In the arrangement shown in FIG. 9, the scintillator 504 is arranged so as not to overlap the region 507 in the orthogonal projection with respect to the principal surface 551 of the substrate 501. When the region 507 is arranged, stray light from the scintillator 504 to the region 503 can be reduced, so that a signal output from each pixel 400 in the region 503 can be stabilized. The structure of the pixels 400 among the plurality of pixels 400, which are arranged in the region 502 and the region 503, may be the same as the structure of the pixel 400 among the plurality of pixels 400, which is arranged in the region 507. Further, as shown in FIG. 9, the scintillator 504 is arranged on the principal surface 551 of the substrate 501, and the light shielding member 505 is arranged so as to overlap the region 507 in addition to the scintillator 504 and the region 503 in the orthogonal projection with respect to the principal surface 551. In this case, in the orthogonal projection with respect to the principal surface 551 of the substrate 501, a portion of the light shielding member 505 overlapping the region 503, a portion overlapping the region 507, and a portion overlapping the scintillator 504 may be connected to each other. As shown in FIG. 9, the light shielding member 505 may be integrally formed using an aluminum sheet or the like. In this case, similar to the portion overlapping the region 503, the portion of the light shielding member 505 overlapping the region 507 may be bonding to the principal surface 551 of the substrate 501, on which the scintillator 504 is arranged, via the bonding member 510 such as a pressure sensitive adhesive.

Further, as shown in FIG. 11, the shielding member 506 described with reference to each of FIGS. 6 to 8 described above may be arranged so as to cover the region 507. In other words, the shielding member 506 may be arranged so as to at least partially overlap the region 503 and the region 507 in the orthogonal projection with respect to the principal surface 551 of the substrate 501. With this arrangement, radiation obliquely entering the region 503 can be suppressed more.

FIG. 12 shows a modification of the sensor board 300 shown in FIG. 11. As shown in FIG. 12, the pixel region 500 may further include, between the region 502 and the region 507, a region 508 where the pixel 400 among the plurality of pixels 400, which is not used for generation of a radiation image, is arranged. In this case, the scintillator 504 is arranged so as to overlap the region 508 in the orthogonal projection with respect to the principal surface 551 of the substrate 501. As shown in FIG. 12, a portion 504a where the film thickness of the scintillator 504 formed by a vapor deposition step using a hard mask is nonuniform may be arranged so as to overlap above the so-called dummy pixels 400 not used for generation of a radiation image. In other words, in the portion overlapping the region 508, the scintillator 504 includes the portion 504a where the film thickness continuously changes. In the portion 504a of the scintillator 504 where the film thickness continuously changes, the film thickness decreases as the distance from the region 502 increases. The region overlapping the portion 504a where the thickness of the scintillator 504 is nonuniform is not used for formation of a radiation image. With this, the film thickness of the scintillator 504 arranged so as to cover the region 502 becomes uniform, and a difference between outputs of signal values caused by a difference in radiation capture amount can be suppressed.

FIG. 12 shows the sensor board 300 arranged with the region 507 and the region 508 where the pixels 400 not used for generation of a radiation image are arranged. However, the present disclosure is not limited to this. For example, the region 507 may not be arranged. That is, the pixels 400 not used for generation of a radiation image may be arranged only in the region 508 of the pixel region 500, which is covered with the scintillator 504. Further, FIG. 12 shows the arrangement in which the shielding member 506 is arranged, but the shielding member 506 may not be arranged. In this manner, the above-described embodiments may be combined and used, as appropriate.

Figure 13:
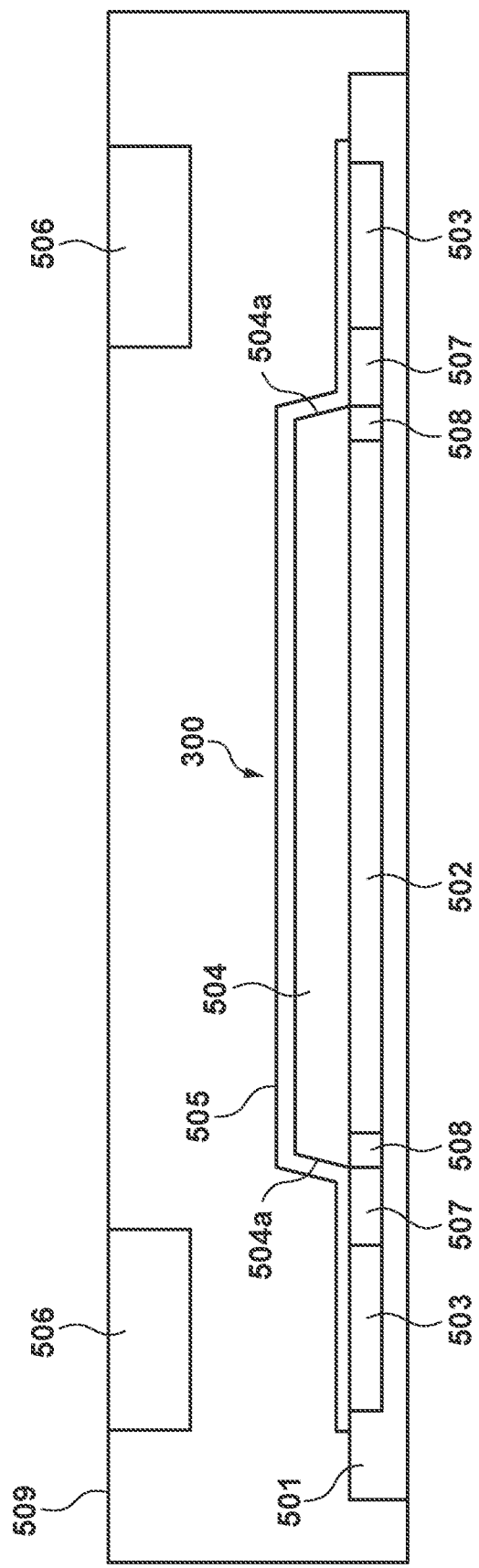
FIG. 13 is a view showing still another arrangement example of the sensor board shown in FIG. 3.

The shielding member 506 is not limited to be bonded to the substrate 501 via the light shielding member 505 or the like as shown in FIGS. 6 to 8, 11, and 12. For example, as shown in FIG. 13, the shielding member 506 may be bonded to the internal wall of a housing 509 of the radiation imaging apparatus 102 via a bonding member such as a double-sided adhesive tape or an adhesive. The light shielding member 505 need only be arranged at an appropriate position in accordance with the positional relationship between the radiation source 113 and the radiation imaging apparatus 102 (sensor board 300) in the radiation imaging system 100.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2022-020793, filed Feb. 14, 2022, which is hereby incorporated by reference herein in its entirety.

What is claimed is:

1. A sensor board comprising:
a substrate comprising a pixel region where a plurality of pixels are arranged on a first principal surface of two principal surfaces;
a scintillator arranged on one of the first principal surface and a second principal surface of the two principal surfaces; and
a light shielding member arranged on the principal surface of the two principal surfaces on which the scintillator is arranged,
wherein the pixel region comprises a first region where pixels among the plurality of pixels, each of which generates a signal corresponding to each pixel of a radiation image, are arranged, and a second region where pixels among the plurality of pixels, each of which generates a signal for correcting a signal output from the first region, are arranged,
the scintillator is arranged so as to overlap the first region but not to overlap the second region in an orthogonal projection with respect to the first principal surface,
the light shielding member is arranged so as to cover the scintillator and overlap the second region in the orthogonal projection with respect to the first principal surface, and
a portion of the light shielding member overlapping the second region is bonded to the principal surface of the two principal surfaces on which the scintillator is arranged.

2. The board according to claim 1, wherein the scintillator is arranged so as to cover the first region of the first principal surface.

3. The board according to claim 1, wherein in the orthogonal projection with respect to the first principal surface, a portion of the light shielding member overlapping the second region and a portion overlapping the scintillator are connected to each other.

4. The board according to claim 1, wherein the pixel region further comprises, between the first region and the second region, a third region where a pixel among the plurality of pixels, which is not used for generation of the radiation image, is arranged, and in the orthogonal projection with respect to the first principal surface, the scintillator is arranged so as not to overlap the third region.

5. The board according to claim 3, wherein the pixel region further comprises, between the first region and the second region, a third region where a pixel among the plurality of pixels, which is not used for generation of the radiation image, is arranged, in the orthogonal projection with respect to the first principal surface, the scintillator is arranged so as not to overlap the third region, in the orthogonal projection with respect to the first principal surface, the light shielding member is arranged so as to further overlap the third region, and in the orthogonal projection with respect to the first principal surface, a portion of the light shielding member overlapping the second region, a portion overlapping the third region, and a portion overlapping the scintillator are connected to each other.

6. The board according to claim 5, wherein the portion of the light shielding member overlapping the third region is bonded to the principal surface of the two principal surfaces on which the scintillator is arranged.

7. The board according to claim 4, wherein the pixel region further comprises, between the first region and the third region, a fourth region where a pixel among the plurality of pixels, which is not used for generation of the radiation image, is arranged, and in the orthogonal projection with respect to the first principal surface, the scintillator is arranged so as to overlap the fourth region.

8. The board according to claim 7, wherein the scintillator includes, in a portion overlapping the fourth region, a portion where a film thickness continuously changes.

9. The board according to claim 8, wherein in the portion of the scintillator where the film thickness continuously changes, the film thickness decreases as a distance from the first region increases.

10. The board according to claim 1, wherein a shielding member configured to shield radiation is arranged so as to at least partially overlap the second region in the orthogonal projection with respect to the first principal surface.

11. The board according to claim 4, wherein
a shielding member configured to shield radiation is arranged so as to at least partially overlap the second region and the third region in the orthogonal projection with respect to the first principal surface.

12. The board according to claim 10, wherein
the shielding member is arranged so as not to overlap the first region in the orthogonal projection with respect to the first principal surface.

13. The board according to claim 10, wherein
the shielding member contains a material having a specific gravity higher than a specific gravity of the light shielding member.

14. The board according to claim 13, wherein
the light shielding member contains aluminum, and
the shielding member contains at least one of lead or tungsten.

15. A radiation imaging apparatus comprising:
the sensor board according to claim 1; and
a control circuit configured to control an operation of the sensor board.

16. A radiation imaging system comprising:
the radiation imaging apparatus according to claim 15; and
a radiation source configured to emit radiation to the radiation imaging apparatus.

17. A radiation imaging system comprising
the sensor board according to claim 10,
a control circuit configured to control an operation of the sensor board, and
a radiation source configured to emit radiation to the sensor board,
wherein the shielding member is arranged so as not to overlap a virtual line connecting the radiation source and the first region.

18. A method of manufacturing a sensor board comprising:
a substrate comprising a pixel region where a plurality of pixels are arranged on a first principal surface of two principal surfaces;
a scintillator arranged on one of the first principal surface and a second principal surface of the two principal surfaces; and
a light shielding member arranged on the principal surface of the two principal surfaces on which the scintillator is arranged,
wherein the pixel region comprises a first region where pixels among the plurality of pixels, each of which generates a signal corresponding to each pixel of a radiation image, are arranged, and a second region where pixels among the plurality of pixels, each of which generates a signal for correcting a signal output from the first region, are arranged, and
the method comprises:
forming the scintillator so as to overlap the first region but not to overlap the second region in an orthogonal projection with respect to the first principal surface; and
arranging the light shielding member so as to cover the scintillator and overlap the second region in the orthogonal projection with respect to the first principal surface, and bonding a portion of the light shielding member overlapping the second region to the principal surface of the two principal surfaces on which the scintillator is arranged.

19. The method according to claim 18, wherein
the scintillator is formed using a hard mask.

* * * * *